United States Patent
Tsuchihashi et al.

(10) Patent No.: US 11,096,294 B2
(45) Date of Patent: Aug. 17, 2021

(54) PORTABLE INFORMATION DEVICE AND DISPLAY ASSEMBLY

(71) Applicant: LENOVO (SINGAPORE) PTE. LTD., Singapore (SG)

(72) Inventors: Moriyuki Tsuchihashi, Yokohama (JP); Kenji Watamura, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 16/856,127

(22) Filed: Apr. 23, 2020

(65) Prior Publication Data

US 2020/0389986 A1 Dec. 10, 2020

(30) Foreign Application Priority Data

Jun. 10, 2019 (JP) .............................. JP2019-107891

(51) Int. Cl.
*H05K 5/00* (2006.01)
*H05K 5/02* (2006.01)
*G06F 1/16* (2006.01)
*G06F 3/041* (2006.01)

(52) U.S. Cl.
CPC ......... *H05K 5/0017* (2013.01); *G06F 1/1626* (2013.01); *G06F 1/1641* (2013.01); *G06F 3/041* (2013.01); *H05K 5/0226* (2013.01); *G06F 2203/04102* (2013.01)

(58) Field of Classification Search
None
See application file for complete search history.

(56) References Cited

U.S. PATENT DOCUMENTS

| 2014/0111954 A1* | 4/2014 | Lee ...................... G06F 1/1652 361/749 |
| 2015/0261259 A1* | 9/2015 | Endo ...................... G06F 3/042 361/679.06 |
| 2016/0007441 A1* | 1/2016 | Matsueda ........... H01L 51/0097 361/749 |
| 2016/0062516 A1* | 3/2016 | Jeong ................... G06F 1/1643 345/174 |
| 2016/0378224 A1* | 12/2016 | Kwon ..................... G06F 3/044 345/174 |

(Continued)

FOREIGN PATENT DOCUMENTS

| EP | 3301506 A1 | 4/2018 |
| JP | 2012190321 A | 10/2012 |

(Continued)

*Primary Examiner* — Xanthia C Cunningham
(74) *Attorney, Agent, or Firm* — Shimokaji IP (57) ABSTRACT

A portable information device includes: a first chassis member; a second chassis member foldably coupled to the first chassis member; a display provided across an inner surface of the first chassis member and an inner surface of the second chassis member, the display being foldable and a touch panel being stacked on the display; and a sheet member fixed to a back side of the display. The sheet member includes: a first layer portion provided with a plurality of holes at least in a part overlapping a bent portion of the display; and a second layer portion entirely covering the first layer portion, the second layer portion being made up of a conductor that is thinner than the first layer portion and having no hole at least in a location overlapping a wiring region of the touch panel.

11 Claims, 7 Drawing Sheets

(56) References Cited

U.S. PATENT DOCUMENTS

| | | | | |
|---|---|---|---|---|
| 2016/0380033 A1* | 12/2016 | Lee | ............... | G06F 1/1652 |
| | | | | 257/40 |
| 2017/0194580 A1 | 7/2017 | Samsung | | |
| 2017/0263890 A1 | 9/2017 | Samsung | | |
| 2017/0295654 A1* | 10/2017 | Choi | ............... | H05K 5/0017 |
| 2017/0309843 A1* | 10/2017 | Kim | ............... | B32B 3/266 |
| 2017/0352706 A1* | 12/2017 | Choi | ............... | G06F 3/0446 |
| 2021/0068270 A1* | 3/2021 | Zhou | ............... | G06F 1/1652 |

FOREIGN PATENT DOCUMENTS

| | | |
|---|---|---|
| JP | 2018112833 A | 7/2018 |
| JP | 2019067279 A | 4/2019 |

\* cited by examiner

PORTABLE INFORMATION DEVICE AND DISPLAY ASSEMBLY

FIELD OF THE INVENTION

The present invention relates to a foldable portable information device and a display assembly.

BACKGROUND OF THE INVENTION

Portable information devices such as a tablet PC and a smartphone have been rapidly spreading in recent years. Such a portable information device has a touch panel type liquid crystal display and does not have a physical keyboard. It is desirable for this kind of portable information device to have a display that is large in use but can be miniaturized to carry. Considering this, a portable information device has been proposed in which use of a flexible display, such as an organic electro luminescence (EL) display, allows not only a chassis but also a display to be foldable (for example, see Japanese Unexamined Patent Application Publication No. 2018-112833).

SUMMARY OF THE INVENTION

The foldable display needs to be bent at a desired radius of curvature selected upon design so that it can stand repetitive bending operations. Meanwhile, the touch panel type display needs to be shielded from electromagnetic noise generated by other electronic components housed in the chassis in order to enable an accurate touch operation by a digitizer pen or a fingertip. The foldable, touch panel type flexible display therefore requires to realize both a smooth bending operation of the display and a noise shielding structure.

The present invention has been made in view of the above-described problem with the prior art, and an object thereof is to provide a portable information device and a display assembly which secure a smooth bending operation and include a noise shielding structure at the same time.

A portable information device according to a first aspect of the present invention is a portable information device including: a first chassis member; a second chassis member foldably coupled to the first chassis member; a display provided across an inner surface of the first chassis member and an inner surface of the second chassis member, the display being foldable and a touch panel being stacked on the display; and a sheet member fixed to a back side of the display, wherein the sheet member includes: a first layer portion provided with a plurality of holes at least in a part overlapping a bent portion of the display; and a second layer portion entirely covering the first layer portion, the second layer portion being made up of a conductor that is thinner than the first layer portion and having no hole at least in a location overlapping a wiring region of the touch panel.

Here, the display is supported by the sheet member including the first layer portion and the second layer portion that is thinner than the first layer portion and is a conductor. The thicker first layer portion causes the sheet member to be bent to form a uniform arc at a bent portion thereof, which makes it possible for the bent portion of the display to be bent at a desired radius of curvature upon design. The plurality of holes in the first layer portion serve to prevent external force required for a bending operation from being excessively great and to suppress increase in weight. Note that the second layer portion, which is made up of a thin conductor and has no hole at least in the location overlapping the wiring region of the touch panel, covers the first layer portion in the portable information device. This prevents the touch panel of the display from being affected by the electromagnetic noise that is generated from electronic components housed in the chassis.

The plurality of holes may be provided in the entire first layer portion. The arc formed by the sheet member when it is bent can then be made even more uniform owing to the entire first layer portion. In addition, weight of the sheet member is reduced.

In the sheet member, a top surface of the second layer portion may be fixed to the back side of the display and the first layer portion may be arranged on a bottom surface side of the second layer portion. This suppresses occurrence of such a trouble that the holes in the first layer portion are embossed on a front side of the display.

Preferably, an inner diameter of each of the holes is 0.5 mm or smaller. This suppresses more surely the occurrence of such a trouble that the holes are embossed on the front side of the display. The inner diameter of 5 mm or smaller also ensures that it is smaller than an outer diameter of a tip of a common pen input device used for a touch operation. Consequently, bumps possibly created by the holes embossed on the front side of the display hardly obstruct the tip of the pen input device.

The sheet member may be structured by stacking a first sheet that makes up the first layer portion and a second sheet that makes up the second layer portion.

The first sheet may be a stainless steel sheet or an aluminum sheet. The second sheet may be a stainless steel sheet, an aluminum sheet, a copper sheet or a carbon sheet.

The sheet member may be made up of one sheet. One side of the sheet may be provided with a plurality of recesses to serve as the first layer portion, and another side of the sheet, which is a back side of the one side, may serve as the second layer portion.

The above aspect of the present invention prevents a trouble in the display from occurring.

DETAILED DESCRIPTION OF THE INVENTION

In the following, a preferred embodiment of a portable information device according to the present invention will be described in detail with reference to accompanying drawings.

Figure 1:
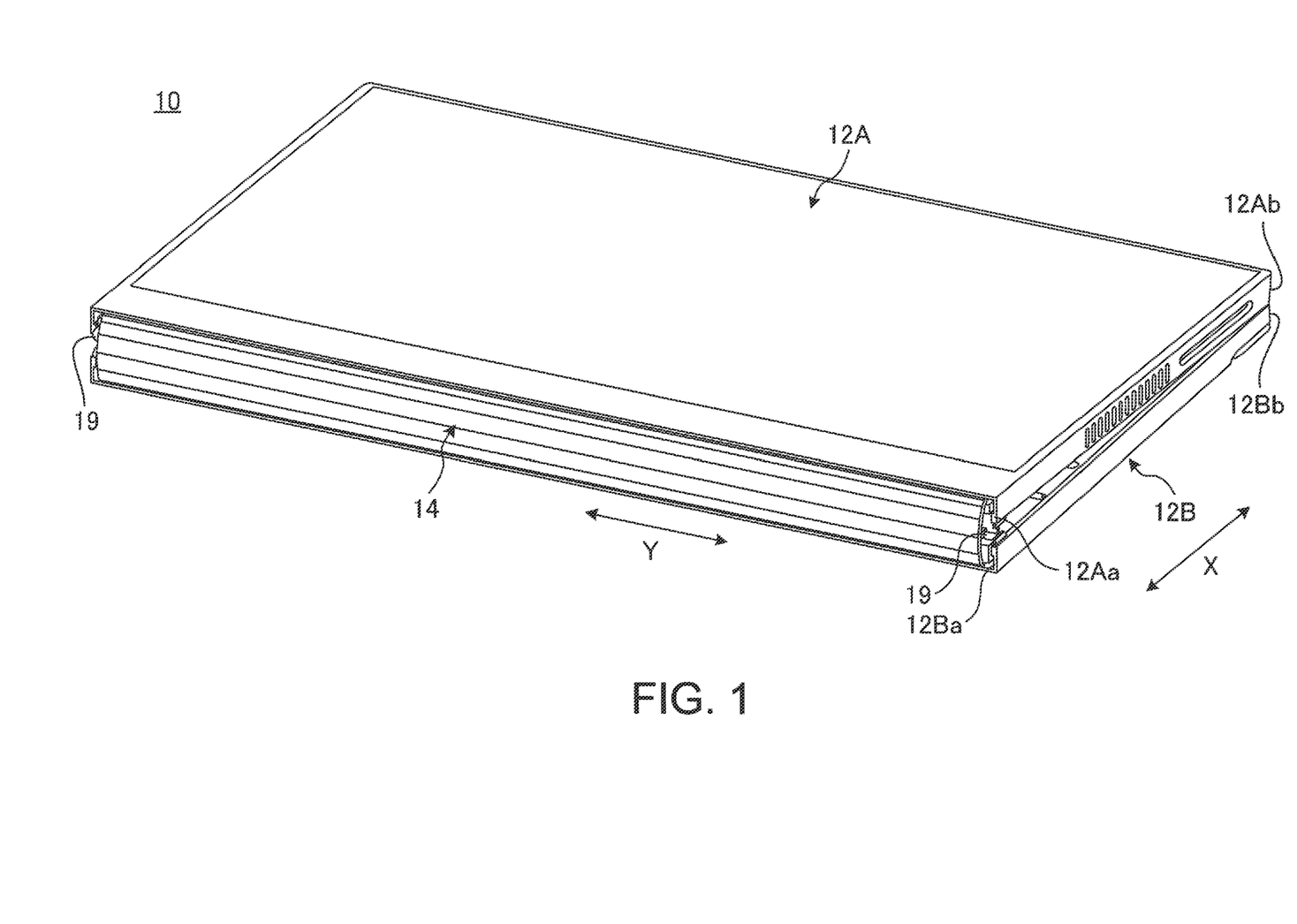
FIG. 1 is a perspective view illustrating a portable information device according to an embodiment that has been closed into a storage form.
Figure 2:
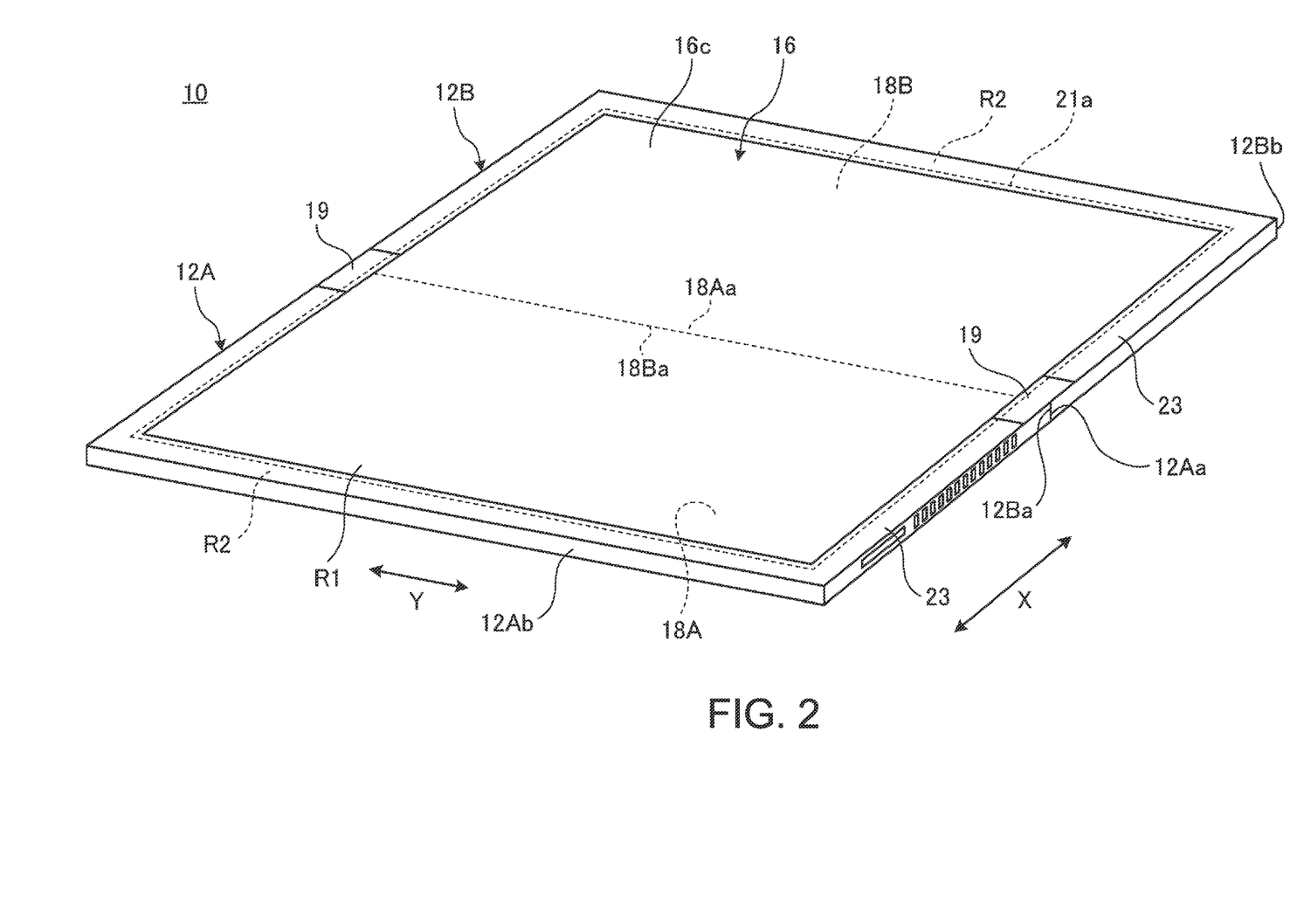
FIG. 2 is a perspective view schematically illustrating the portable information device illustrated in FIG. 1 that has been opened into a usage form.
Figure 3:
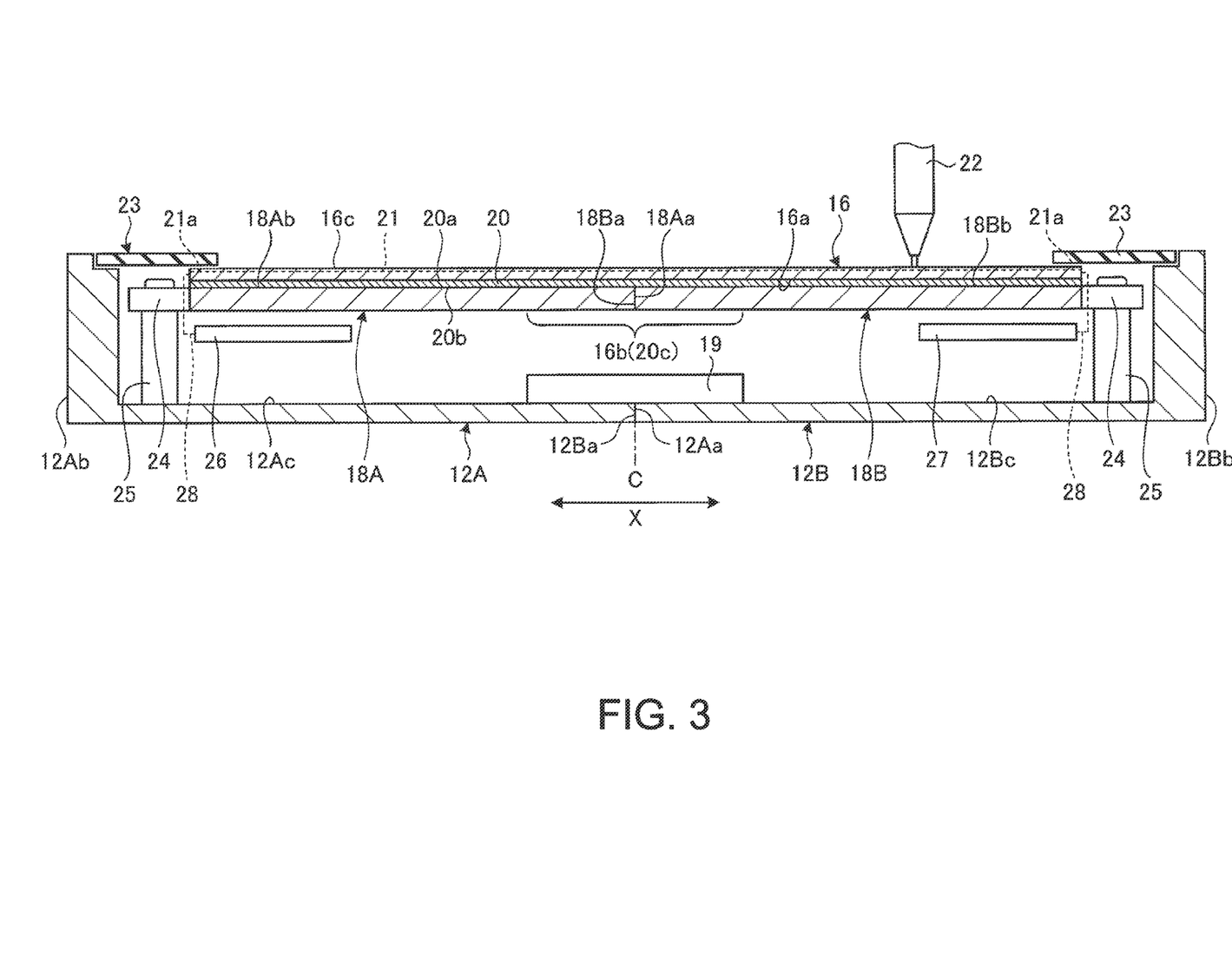
FIG. 3 is a side cross-sectional view schematically illustrating an internal structure of the portable information device illustrated in FIG. 2.

FIG. 1 is a perspective view illustrating a portable information device 10 according to an embodiment that has been closed into a storage form. FIG. 2 is a perspective view schematically illustrating the portable information device 10 illustrated in FIG. 1 that has been opened into a usage form. FIG. 3 is a side cross-sectional view schematically illustrating an internal structure of the portable information device 10 illustrated in FIG. 2.

As illustrated in FIGS. 1 and 2, the portable information device 10 includes a first chassis member 12A, a second chassis member 12B, a spine member 14 and a display 16. In the present embodiment, a tablet PC that is foldable like a folio is exemplarily shown as the portable information device 10. The portable information device 10 may alternatively be a mobile phone, a smartphone, an electronic notebook, a portable game machine or the like.

Each of the chassis members 12A and 12B is a rectangular plate-like member having a side wall that is erected from three sides thereof except for a side corresponding to the spine member 14. Each of the chassis members 12A and 12B is configured by a metal plate of stainless steel, magnesium, aluminum or the like or a fiber-reinforced resin plate containing reinforced fibers such as carbon fibers, for example. The display 16 is provided across the inner surfaces 12Ac and 12Bc of the chassis members 12A and 12B. The display 16 is supported with respect to the inner surfaces 12Ac and 12Bc using a first support plate 18A, a second support plate 18B and a sheet member 20.

The chassis members 12A and 12B are disposed adjacently to each other. The chassis members 12A and 12B are coupled to each other by a pair of hinge mechanisms 19 and 19 that are disposed at both ends of edge portions 12Aa and 12Ba adjacent to each other. The hinge mechanisms 19 couple the chassis members 12A and 12B so that the chassis members are foldable into the storage form illustrated in FIG. 1 as well as opened to the usage form illustrated in FIG. 2. A dashed and dotted line C in FIG. 3 represents a bending center C serving as a center of a folding operation of the chassis members 12A and 12B. In the chassis members 12A and 12B, the edge portions 12Aa and 12Ba by the spine member 14 are hinge-side end portions. In the chassis members 12A and 12B, other edge portions 12Ab and 12Bb that are located opposite from the spine member 14 are open end portions.

The hinge mechanisms 19 are respectively disposed at the both ends in the longitudinal direction (Y direction) of the edge portions 12Aa and 12Ba of the chassis members 12A and 12B and are thus located outside the outer peripheral edge portion of the display 16. In the portable information device 10 of the present embodiment, a rotation center of the chassis members 12A and 12B defined by the hinge mechanism 19 coincides with a front side 16c of the display 16.

In the following description of the portable information device 10, directions from the central spine member 14 to the other edge portions 12Ab and 12Bb are referred to as X direction and directions along the longitudinal direction of the spine member 14 are referred to as Y direction as illustrated in FIGS. 1 and 2.

The display 16 is a touch panel type liquid crystal display, for example. As illustrated in FIG. 3, the touch panel 21 is of electrostatic capacitance type and receives a touch operation by a pen input device 22 such as a digitizer pen and a touch operation by a person's fingertip. The display 16 is a flexible display such as an organic EL having a paper structure with high flexibility, for example. This allows the display 16 to be opened/closed along with an opening/closing operation of the chassis members 12A and 12B. A bezel member 23 is disposed on an outer peripheral edge portion of the front side 16c of the display 16. The bezel member 23 covers a non-display region (inactive region) R2 which is a region excluding a display region (active region) R1 and arranged in the outer peripheral edge portion of the front side of the display 16. A touch operation valid region of the touch panel 21 is arranged in the same area as the display region R1 of the display 16. The touch panel 21 has a wiring region 21a that is about 5 mm in width and is provided at a location overlapping the non-display region R2 surrounding the display region R1 (see FIGS. 2 and 3).

As illustrated in FIG. 3, for example, the display 16 is positioned to be fixed to the chassis members 12A and 12B via attachment pieces 24 protruding from outer peripheral end faces of the support plates 18A and 18B. There are provided a plurality of attachment pieces 24 at appropriate locations in the outer peripheral edge portions of the support plates 18A and 18B except for the adjacent edge portions 18Aa and 18Ba. The attachment pieces 24 are screwed to boss portions 25 provided on the inner surfaces 12Ac and 12Bc, for example. The support plates 18A and 18B are thus attached to the inner surfaces 12Ac and 12Bc of the chassis members 12A and 12B respectively.

In a chassis internal space surrounded by the chassis members 12A and 12B and the support plates 18A and 18B, various components including a substrate, various semiconductor chips such as CPU, etc., a communication module, a battery unit, and a cooling unit are mounted to be fixed. A reference sign 26 in FIG. 3 refers to a control substrate (control board) for the display 16. A reference sign 27 in FIG. 3 refers to a control substrate (touch IC) for the touch panel of the display 16. These control substrates 26 and 27 are connected to the display 16 via a flexible substrate 28 shown by a broken line in FIG. 3.

The spine member 14 is formed of a thin, flexible plate-like member and becomes a spine when the portable information device 10 is folded. The spine member 14 is provided across the chassis members 12A and 12B to cover the edge portions 12Aa and 12Ba from an inside thereof. As illustrated in FIG. 1, when the portable information device 10 is in the storage form, the edge portions 12Aa and 12Ba of the chassis members 12A and 12B are largely separated to generate a gap therebetween. The spine member 14 covers this gap between the edge portions 12Aa and 12Ba so that the display 16 and various components located inside are not exposed.

An exemplary structure of the support plates 18A and 18B is now described. As illustrated in FIG. 3, each of the support plates 18A and 18B is a thin, plate member. The support plates 18A and 18B support the display 16 on top surfaces 18Ab and 18Bb thereof via the sheet member 20. The support plates 18A and 18B are supported by the chassis members 12A and 12B respectively and are opened and closed around the bending center C like a folio.

Each of the support plates 18A and 18B is formed of a metal plate of stainless steel, magnesium, aluminum or the like or a fiber-reinforced resin plate produced by impregnating reinforced fibers such as carbon fibers in a matrix resin containing a thermosetting resin and a thermoplastic resin, for example. In the usage form, the adjacent edge portions 18Aa and 18Ba of the support plates 18A and 18B abut on each other (see FIG. 5A). In the storage form, the edge portions 18Aa and 18Ba of the support plates 18A and 18B are separated from each other (see FIG. 5B).

An exemplary structure of the sheet member 20 is described next. As illustrated in FIG. 3, the sheet member 20 is sandwiched between a back side 16a of the display 16 and the top surfaces 18Ab and 18Bb of the support plates 18A and 18B. A top surface 20a of the sheet member 20 is entirely stuck onto the back side 16a of the display 16. A bottom surface 20b of the sheet member 20 is stuck onto top surfaces 18Ab and 18Bb of the support plates 18A and 18B in large part. That is, in the bottom surface 20b of the sheet member 20, only a strip region (bent portion 20c) corresponding to the bent portion 16b of the display 16 (see FIG. 3) is not stuck onto the top surfaces 18Ab and 18Bb so as to be free to move (see FIG. 5B).

Figure 4:
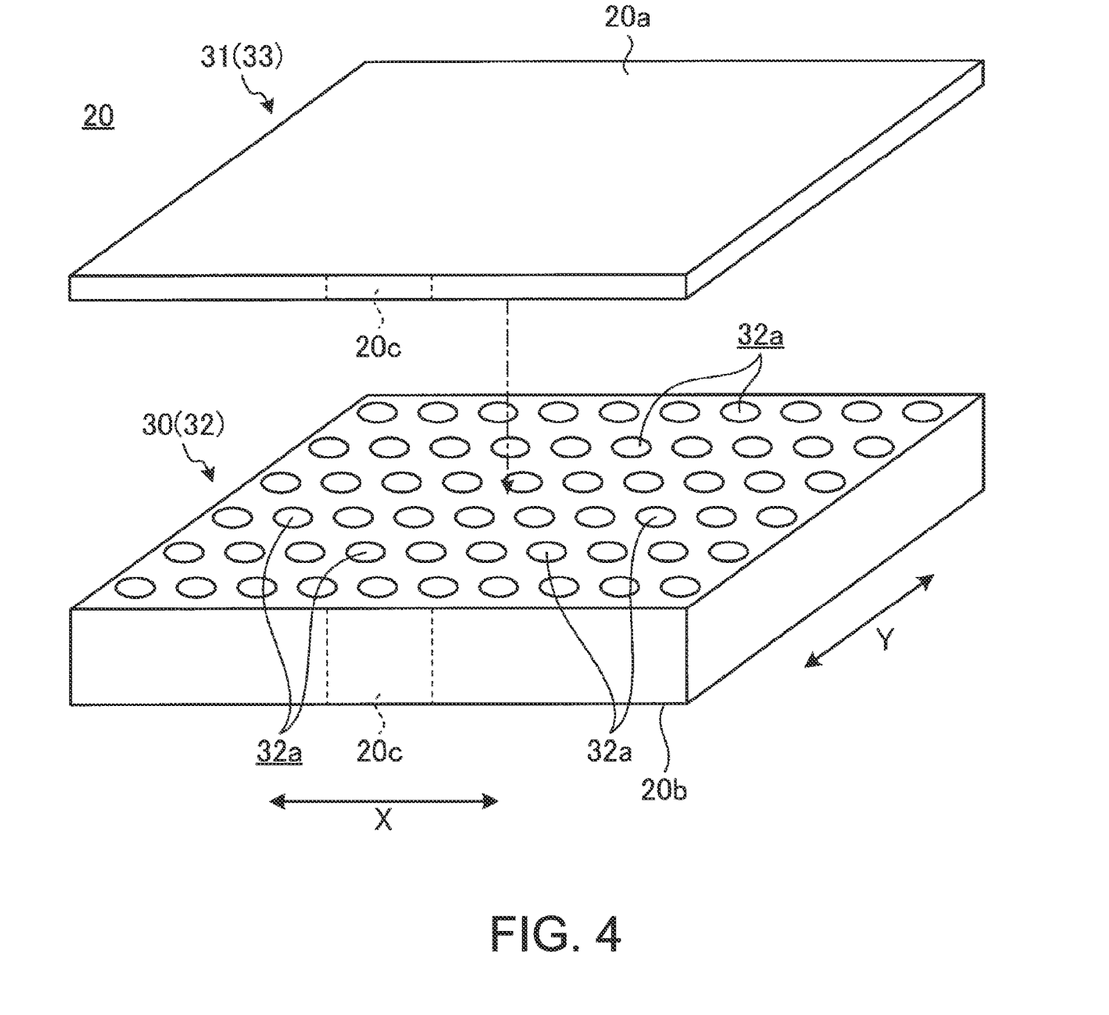
FIG. 4 is an exploded perspective view schematically illustrating a structure of a sheet member.
Figure 5A:
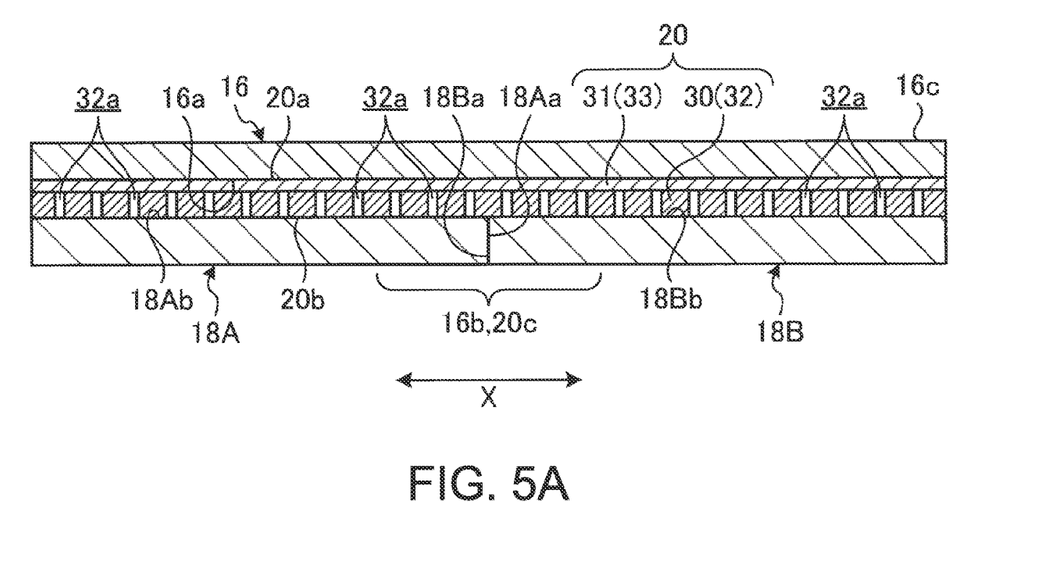
FIG. 5A is a side cross-sectional view schematically illustrating a structure of the sheet member and its peripheral part in the usage form.
Figure 5B:
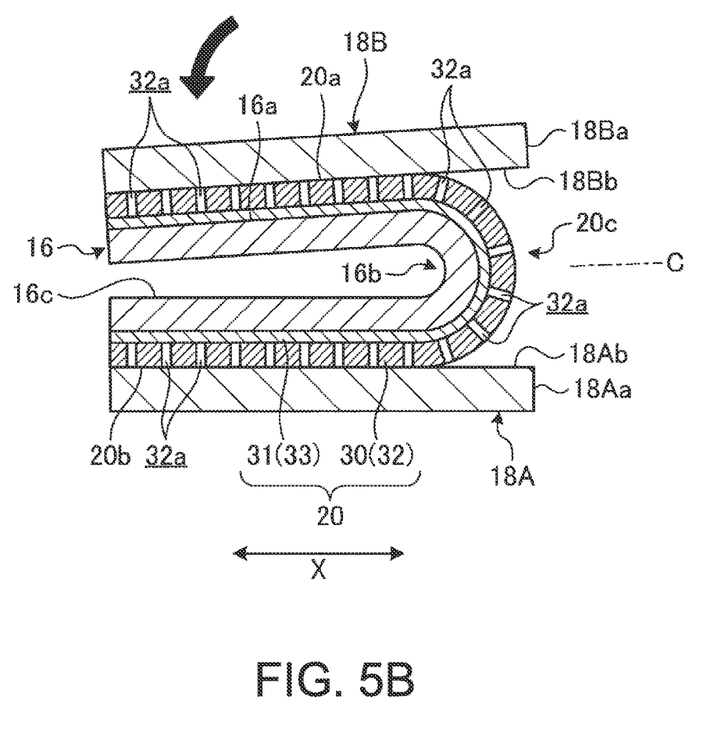
FIG. 5B is a side cross-sectional view schematically illustrating the structure of the sheet member and its peripheral part in the storage form.

FIG. 4 is an exploded perspective view schematically illustrating a structure of the sheet member 20. FIG. 5A is a side cross-sectional view schematically illustrating a structure of the sheet member 20 and its peripheral part in the usage form. FIG. 5B is a side cross-sectional view schematically illustrating the structure of the sheet member and its peripheral part in the storage form. As illustrated in FIGS. 4 and 5, the sheet member 20 includes a first layer portion 30 and a second layer portion 31 and is flexible.

The first layer portion 30 is made up of a first sheet 32 provided with a plurality of holes 32a. The first sheet 32 is a metal sheet such as a stainless steel sheet, an aluminum sheet or the like. The first sheet 32 of the present embodiment is formed of SUS 301 or SUS 304 austenitic stainless steel, for example. A plate thickness of the first sheet 32 is about 150 µm, for example. An inner diameter of each hole 32 is preferably smaller than at least an outer diameter of a tip of the pen input device 22 (which is about 1 mm, for example) used for the portable information device 10. In the present embodiment, the inner diameter of each hole 32a is thus set to 0.5 mm or smaller, preferably 0.2 mm or 0.3 mm, for example. The first sheet 32 of the present embodiment is a punched metal sheet, a mesh sheet or the like entirely provided with the holes 32a penetrating the sheet. The holes 32a may not be provided in the entire first sheet 32. It is, however, preferable that the holes 32a are provided at least in the bent portion 20c. The cross-sectional shape of each hole 32a may not only be circular but also rectangular, polygonal or others. If the cross-sectional shape of the each hole 32a is rectangular, the minor axis of thereof may be set to 0.5 mm or smaller, preferably 0.2 mm or 0.3 mm.

Also, as shown in FIG. 4, the holes 32a may be provided in the entire first layer portion 32. Particularly, a first sheet 32 may have holes 32a provided in at least the entire part overlapping the display 16. The arc formed by the sheet member 20 when it is bent can then be made even more uniform owing to the entire first layer portion 32. In addition, weight of the sheet member 20 is reduced.

The second layer portion 31 is made up of a second sheet 33. The second sheet 33 is a metal sheet such as a stainless steel sheet, an aluminum sheet, a copper sheet or the like or a conductor such as a carbon sheet. The carbon sheet is a carbon-fiber-reinforced resin sheet produced by impregnating carbon fibers in a matrix resin containing a thermosetting resin and a thermoplastic resin, for example. The second sheet 33 of the present embodiment is formed of SUS 301 or SUS 304, for example. A plate thickness of the second sheet 33 is thinner than that of the first sheet 32 and is about 30 µm, for example.

The first layer portion 30 and the second layer portion 31 of the sheet member 20 are provided by adhering the first sheet 32 and the second sheet 33 to each other. Facing surfaces of the first sheet 32 and the second sheet are entirely adhered and fixed to each other by an adhesive, a double-sided tape or the like, for example. Consequently, the second layer portion 31 of the sheet member 20, which is made up of a conductor that is thinner than the first layer portion 30 and has no hole at least in a location overlapping the touch operation valid region, closes the holes 32a of the first layer portion 30 on a top surface 20a side. Note that the second layer portion 31 is required to prevent the touch panel 21 from being affected by noise that the first layer portion 30 failed to cut off. This is why the second layer portion 31 has no hole at least in a location overlapping the touch operation surface and the wiring region 21a of the touch panel.

As illustrated in FIGS. 5A and 5B, the second layer portion 31 (second sheet 33) of the sheet member 20 is fixed to the back side 16a of the display 16. Meanwhile, the first layer portion 30 (first sheet 32) of the sheet member 20 is fixed to the top surfaces 18Ab and 18Bb of the support plates 18A and 18B. The adhesion and fixation of the second layer portion 31 and the display 16 are achieved by using an adhesive, a double-sided tape or the like, for example. The adhesion and fixation of the first layer portion 30 and the support plates 18A and 18B are achieved by using an adhesive, a double-sided tape or the like, for example. As described above, the part of the bottom surface 20b of the first layer portion 30 that corresponds to the bent portion 20c is not fixed to the support plates 18A and 18B so as to be able to contact therewith and separate therefrom (see FIG. 5B).

The first layer portion 30 and the second layer portion 31 of the sheet member 20 may be replaced by each other. In that case, however, the first layer portion 30 having the holes 32a is arranged right under the display 16. Depending on a size of each hole 32a and the structure of the display 16, this may cause two troubles as follows: Firstly, irregularities formed by edges of the holes 32a may be embossed on the front side 16c of the display 16. Secondly, the embossed irregularities on the front side 16c of the display 16 may obstruct the pen input device 22 or fingertip. To eliminate these troubles, in the sheet member 20 of the present embodiment, the second layer portion 31 is arranged right under the display 16 as illustrated in FIG. 3.

Now, an advantage provided by the sheet member 20 including the first layer portion 30 and the second layer portion 31 is described.

Figure 6:
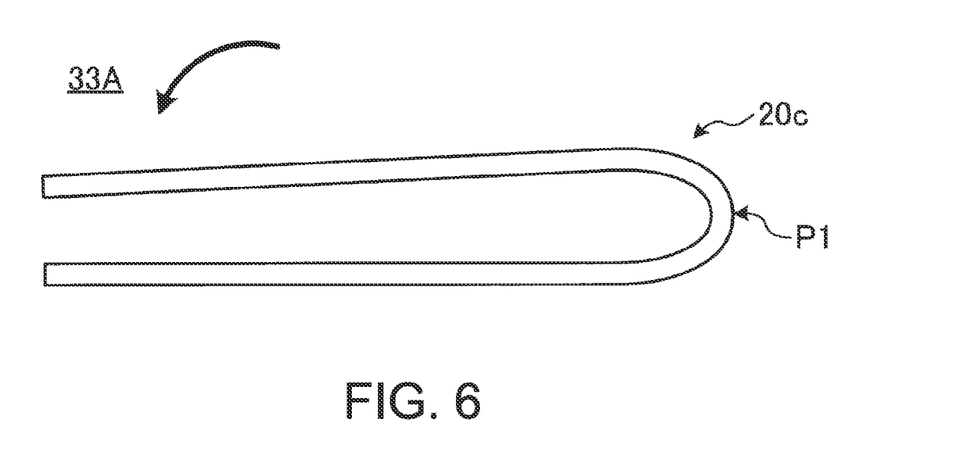
FIG. 6 is a side view schematically illustrating a shape of a bent portion when a thin sheet alone is bent.

Assume that the sheet member 20 is made up only of a sheet 33A, which is identical to the thin second sheet 33, as illustrated in FIG. 6. A radius of curvature at a peak P1 of the bent portion 20c of the sheet 33A is smaller than a design radius of curvature of the display 16. This is because the thin sheet 33A has a minute reaction force when it is bent and thus forms a shape that is bent about the peak P1 as illustrated in FIG. 6. Consequently, the bent portion 16b of the display 16 has a sharp-pointed bent shape similar to the bent portion 20c shown in FIG. 6 at a part corresponding to the peak P1. This causes the radius of curvature at which the display 16 is bent to be smaller than a radius of curvature upon design, which may cause a trouble. Note, however, that the sheet 33A is advantageously lightweight.

Figure 7:
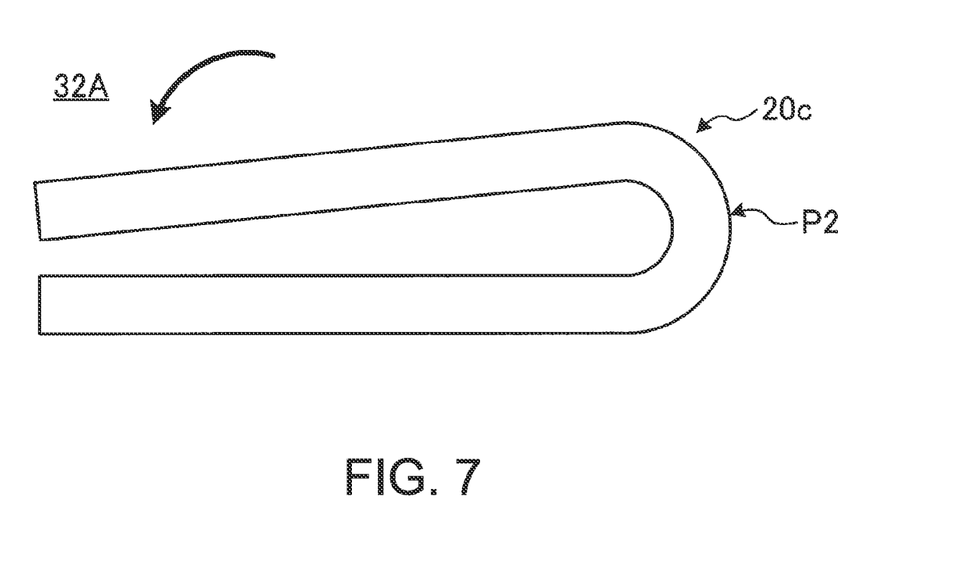
FIG. 7 is a side view schematically illustrating a shape of a bent portion when a sheet having a thickness of certain degree alone is bent.

Now, assume that the sheet member 20 is made up only by a sheet 32A, which has a thickness of certain degree and is identical to the first sheet 32 except that it is not provided with holes 32a, as illustrated in FIG. 7. A radius of curvature at a peak P2 of the bent portion 20c of the sheet 32A is substantially equal to a radius of curvature of the display 16 upon design, and the bent portion 20c forms a uniform curve. This is because the sheet 32A with a certain thickness has a high section modulus and a certain reaction force and thus does not form such a bent shape as that formed by the sheet 33A but draws a uniform arc as illustrated in FIG. 7. Consequently, a part of the bent portion 16b of the display 16 that corresponds to the peak P2 has a desired radius of curvature upon design, as a result of which repetitive bending hardly causes a trouble. Note that the sheet 32A is heavier than the sheet 33A illustrated in FIG. 6. Note also that the sheet 32A has a large reaction force when it is bent and therefore needs a great force to be bent. As such, a great force would be required to open/close the chassis members 12A and 12B.

In view of the above, the sheet member 20 of the present embodiment employs the first layer portion 30 made up of the first sheet 32 with a certain thickness like the sheet 32A illustrated in FIG. 7 and the second layer portion 31 made up of the thin second sheet 33 like the sheet 33A illustrated in FIG. 6. The first sheet 32 is provided with a plurality of holes 32a at least in a part corresponding to the bent portion 20c. Consequently, the thick first sheet 32 enables the sheet member 20 to be bent to form a uniformly curved bent portion 20c as illustrated in FIG. 5B, which ensures the radius of curvature of the bent portion 16b of the display 16 to agree with a design specification. The plurality of holes 32a in the first sheet 32 serve to suppress increase in weight and to reduce force required for bending in some degree.

Note that 1.8-MHz radiation magnetic field must be shielded in order to protect the digitizer pen from noise affecting the operation thereof. The holes 32a provided in the first sheet 32, however, do not allow eddy current for shielding the radiation magnetic field to flow in the periphery thereof, and the first sheet 32 alone gives only a low shielding effect accordingly. An additional conductive sheet having no hole is thus required to be able to effectively shield the radiation magnetic field. This is why the first sheet 32 in the sheet member 20 is covered by the second sheet 33 which is thin and has no hole at least in a location overlapping the touch operation surface and the wiring region 21a of the touch panel 21. The second layer portion 31 then functions as a noise shielding layer shielding electromagnetic noise that passes through the first layer portion 30. This prevents the touch panel 21 of the display 16 from being affected by the electromagnetic noise that is generated and transmitted from a semiconductor chip, a battery unit, etc. stored under the sheet member 20 via the holes 32a. As a result, the touch operation by the pen input device 22 or the fingertip on the touch panel 21 is not disturbed by the electromagnetic noise, which enables a smooth touch operation. Note, in particular, that the second sheet 33 is made up of a stainless steel sheet in the present embodiment, which allows a high noise shielding effect to be obtained by heat loss caused by occurrence of the eddy current. It is needless to say that the second sheet 33 may be made up of an aluminum sheet or the like which has electric resistance lower than that of the stainless steel sheet. The second sheet 33 then provides a high noise shielding effect because aluminum reflects magnetic field.

As described above, in the portable information device 10 of the present embodiment, the sheet member 20 fixed to the back side 16a of the display 16 includes the first layer portion 30 and the second layer portion 31. The first layer portion 30 is provided with a plurality of holes 32a. The second layer portion 31 is made up of a conductor that is thinner than the first layer portion 30 and closes the holes 32a in the first layer portion 30.

This enables, owing to the first layer portion 30 having a certain thickness, the bent portion 16b of the display 16 in the portable information device 10 to be bent at a desired radius of curvature upon design. The plurality of holes 32a in the first layer portion 30 serve to prevent external force required for a bending operation from being excessively great and to suppress increase in weight. It is also to be noted that, in the portable information device 10, the second layer portion 31 made up of a thin conductor that closes the holes 32a in the first layer portion 30 on one side. This prevents the touch panel 21 of the display 16 from being affected by the electromagnetic noise that is generated and transmitted from electronic components housed in the chassis via the holes 32a in the first layer portion 30.

The first layer portion 30 and the second layer portion 31 of the sheet member 20 are provided by stacking the first sheet 32 and the second sheet 33. As such, the sheet member 20 can be manufactured easily and structured simply.

Figure 8:
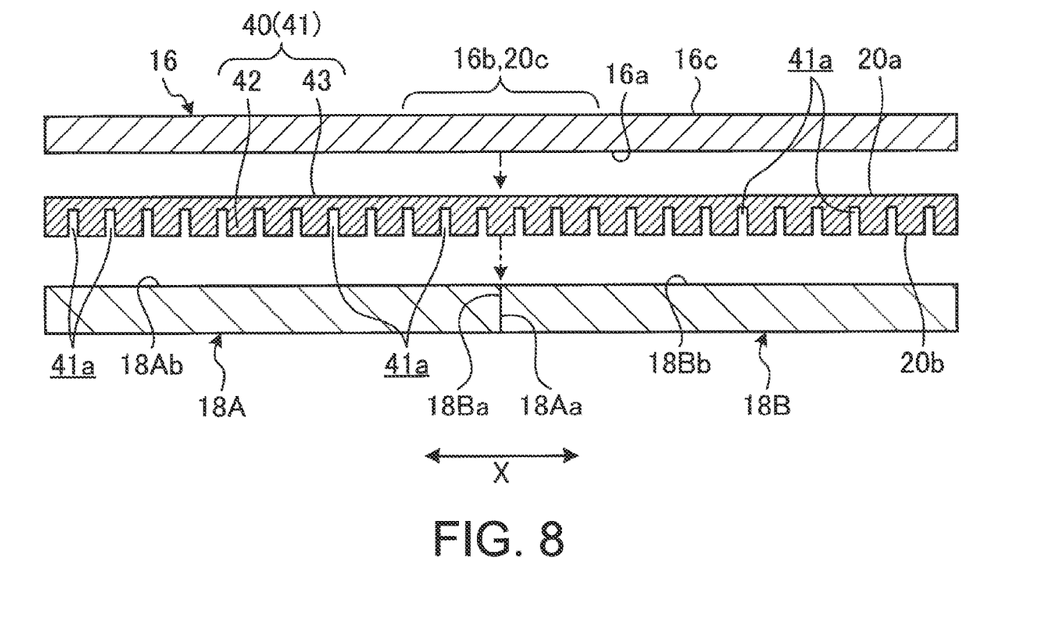
FIG. 8 is a side cross-sectional view of a sheet member according to a first modified example.

Note that the sheet member may be a sheet made up of a plurality of layers. FIG. 8 is a side cross-sectional view of a sheet member 40 according to a first modified example. It is an exploded view illustrating the sheet member 40 along with the display 16 and the support plates 18A and 18B to be fixed to the top and bottom thereof respectively. As illustrated in FIG. 8, the sheet member 40 has one sheet 41 including a first layer portion 42 and a second layer portion 43. The sheet 41 is a metal sheet such as a stainless steel sheet, an aluminum sheet or the like, for example. A plate thickness of the sheet 41 is about 180 µm, for example.

The first layer portion 42 is formed on a bottom surface 20b side of the sheet 41. A plate thickness of the first layer portion 42 is about 150 µm, for example. The first layer portion 42 is provided with a plurality of recesses 41a that are open to the bottom surface 20b. An inner diameter of each recess 41a may be the same as that of each hole 32a described above and is 0.5 mm or smaller, preferably 0.2 mm or 0.3 mm, for example. The recesses 41a are illustrated as being provided in the entire bottom surface 20b. It is sufficient, however, if the recesses 41a are provided at least in the bent portion 20c. The second layer portion 43 is formed on a top surface 20a side of the sheet 41. A plate thickness of the second layer portion 43 is thinner than that of the first layer portion 42 and is about 30 µm, for example. The plurality of recesses 41a on the bottom surface 20b side are provided to the sheet member 40 by etching the sheet 41, for example.

The sheet member 40 accordingly has such a structure that the holes penetrating the first layer portion 42 in a plate-thickness direction are closed on one side by the second layer portion 43, which results in the recesses 41a in the first layer portion 42. The first layer portion 42 and second layer portion 43 of the sheet member 40 thus allow the touch panel 21 to be prevented from being affected by the electromagnetic noise generated from electronic components housed in the chassis while keeping the shape of the bent portion 16b of the display 16 appropriately. It is further to be noted that such sheet member 40 made up of one sheet 41 is easy to manufacture and can reduce the number of components.

Figure 9:
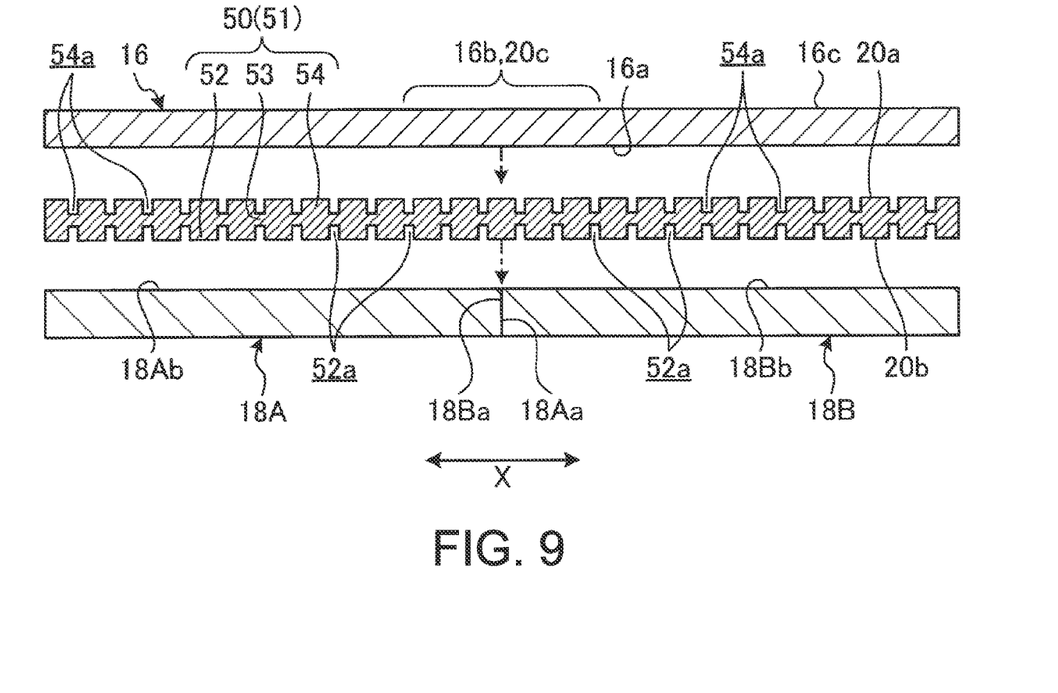
FIG. 9 is a side cross-sectional view of a sheet member according to a second modified example.

FIG. 9 is a side cross-sectional view of a sheet member 50 according to a second modified example. It is an exploded view illustrating the sheet member 50 along with the display 16 and the support plates 18A and 18B to be fixed to the top and bottom thereof respectively. As illustrated in FIG. 9, the sheet member 50 has one sheet 51 including a first layer portion 52, a second layer portion 53 and a third layer portion 54. The sheet 51 is a metal sheet such as a stainless steel sheet, an aluminum sheet, a copper sheet or the like, for example. A plate thickness of the sheet 51 is about 180 μm, for example.

The first layer portion 52 is formed on a bottom surface 20b side of the sheet 51. A plate thickness of the first layer portion 52 is about 75 μm, for example. The first layer portion 52 is provided with a plurality of recesses 52a that are open to the bottom surface 20b. An inner diameter of each recess 52a may be the same as that of each hole 32a described above and is about 0.1 to 0.5 mm, preferably 0.2 mm or 0.3 mm, for example. The third layer portion 54 is formed on a top surface 20a side of the sheet 51. A plate thickness of the third layer portion 54 is about 75 μm, for example. The third layer portion 54 is provided with a plurality of recesses 54a that are open to the top surface 20a. An inner diameter of each recess 54a may be the same as that of each hole 32a described above and is about 0.5 mm or smaller, preferably 0.2 mm or 0.3 mm, for example. The second layer portion 53 is formed between the first layer portion 52 and the third layer portion 54. A plate thickness of the second layer portion 53 is thinner than those of the first layer portion 52 and the third layer portion 54 and is about 30 μm, for example. The plurality of recesses 52a on the bottom surface 20b side and the plurality of recesses 54a on the top surface 20a side are provided to the sheet member 50 by etching the sheet 51, for example.

The sheet member 50 accordingly has such a structure that the holes penetrating the first layer portion 52 in a plate-thickness direction are closed on one side by the second layer portion 53, which results in the recesses 52a in the first layer portion 52. The sheet member 50 further includes the third layer portion 54 provided with the plurality of recessed portions 54a so that the third layer portion 54 and the first layer portion 52 together produce effects that are similar to those produced by the above-described first layer portions 30 and 42 of the sheet members and 40. These first layer portion 52, second layer portion 53 and third layer portion 54 of the sheet member 50 thus allow the touch panel 21 to be prevented from being affected by the electromagnetic noise generated from electronic components housed in the chassis while keeping the shape of the bent portion 16b of the display 16 appropriately.

The present invention is not limited to the foregoing embodiment, and modifications can be freely made without departing from the scope of the present invention.

The above has exemplarily described that the display 16 as well as the sheet member 20 and others stuck thereto are attached to the chassis members 12A and 12B via the support plates 18A and 18B. However, the support plates 18A and 18B may be omitted. The sheet member 20 and others may then be supported by a boss-like member, a post member or the like that are formed to protrude from the inner surfaces 12Ac and 12Bc of the chassis members 12A and 12B, for example.

The above has exemplarily described that the first layer portion 30 of the sheet member 20 is made up of the first sheet 32 which is a metal sheet. The first sheet 32 may, however, be a resin sheet made of polyimide or the like, for example, because the second layer portion 31 of the sheet member 20, which is a conductor, serves to shield noise.

Description has been made in the above of the portable information device 10 that is foldable into a double-folded state like a folio. Note that the portable information device of the present invention may be configured not only with two chassis members of the same shape connected to each other in a foldable manner, but also with: a larger chassis member and two smaller chassis members foldably coupled to the left and right edge portions of the larger chassis member like double doors; one chassis member to each of left and right sides thereof a chassis member is coupled, wherein the left and right chassis members have different folding directions so that the three chassis members form an S-shape; a larger chassis member and a smaller chassis member foldably connected to either one of left and right edge portions of the larger chassis member to form a J-shape, for example. Four or more chassis members may be coupled to each other.

The invention claimed is:

1. A portable information device comprising:
a first chassis member;
a second chassis member foldably coupled to the first chassis member;
a display across an inner surface of the first chassis member and an inner surface of the second chassis member, the display being foldable and a touch panel stacked on the display; and
a sheet member fixed to a back side of the display,
wherein the sheet member comprises:
a first layer portion having a plurality of holes at least in a part overlapping a bent portion of the display; and
a second layer portion entirely covering the first layer portion, the second layer portion being made of a conductor that is thinner than the first layer portion and having no hole in at least a location overlapping a wiring region of the touch panel.

2. The portable information device according to claim 1, wherein the plurality of holes are in the entire first layer portion.

3. The portable information device according to claim 1, wherein, in the sheet member, a top surface of the second layer portion is fixed to the back side of the display and the first layer portion is on a bottom surface side of the second layer portion.

4. The portable information device according to claim 1, wherein an inner diameter of each of the holes is 0.5 mm or smaller.

5. The portable information device according to claim 1, wherein the sheet member has a stacked structure of a first sheet that makes up the first layer portion and a second sheet that makes up the second layer portion.

6. The portable information device according to claim 5, wherein
the first sheet is a stainless steel sheet or an aluminum sheet, and
the second sheet is a stainless steel sheet, an aluminum sheet, a copper sheet or a carbon sheet.

7. The portable information device according to claim 1, wherein the sheet member is made up of one sheet, one side of the one sheet having a plurality of recesses to serve as the first layer portion, and another side of the one sheet, which is a back side of the one side, serving as the second layer portion.

8. A display assembly comprising:
a display that is foldable, a touch panel being stacked on the display; and
a sheet member fixed to a back side of the display,
wherein the sheet member comprises:

a first layer portion having a plurality of holes at least in a part overlapping a bent portion of the display; and a second layer portion entirely covering the first layer portion, the second layer portion being made of a conductor that is thinner than the first layer portion and having no hole in at least a location overlapping a wiring region of the touch panel.

9. The display assembly according to claim 8, wherein the plurality of holes are in the entire first layer portion.

10. The display assembly according to claim 8, wherein, in the sheet member, a top surface of the second layer portion is fixed to the back side of the display and the first layer portion is on a bottom surface side of the second layer portion.

11. A display assembly comprising:

a display that is foldable, a touch panel being stacked on the display; and a sheet member fixed to a back side of the display, wherein the sheet member includes a first layer portion having a plurality of holes in at least a part overlapping a bent portion of the display.

\* \* \* \* \*